(12) United States Patent
Bell et al.

(10) Patent No.: US 10,468,421 B2
(45) Date of Patent: *Nov. 5, 2019

(54) MEMORY CELLS AND MEMORY ARRAYS

(71) Applicant: Micron Technology Inc., Boise, ID (US)

(72) Inventors: Debra M. Bell, Tokyo (JP); Scott J. Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/204,409

(22) Filed: Nov. 29, 2018

(65) Prior Publication Data

US 2019/0096894 A1 Mar. 28, 2019

Related U.S. Application Data

(63) Continuation of application No. 15/796,611, filed on Oct. 27, 2017, now Pat. No. 10,177,159.

(Continued)

(51) Int. Cl.
| | |
|---|---|
| *G11C 11/412* | (2006.01) |
| *H01L 27/11* | (2006.01) |
| *H01L 21/762* | (2006.01) |
| *H01L 27/02* | (2006.01) |
| *H01L 27/06* | (2006.01) |
| *G11C 11/419* | (2006.01) |

(52) U.S. Cl.
CPC .... *H01L 27/1112* (2013.01); *H01L 21/76202* (2013.01); *H01L 27/0207* (2013.01); *H01L 27/0688* (2013.01); *H01L 27/1104* (2013.01); *H01L 27/1108* (2013.01); *G11C 11/412* (2013.01); *G11C 11/419* (2013.01)

(58) Field of Classification Search
CPC . G11C 11/412; G11C 11/419; H01L 27/1112; H01L 21/76202; H01L 27/1104
See application file for complete search history.

(56) References Cited

U.S. PATENT DOCUMENTS

| | | |
|---|---|---|
| 5,808,941 A | 9/1998 | Roberts |
| 6,208,555 B1 | 3/2001 | Noble |
| | (Continued) | |

OTHER PUBLICATIONS

Colinge et al., "Nanowire Transistors Without Junctions", Nature Nanotechnology, vol. 5, Mar. 2010, pp. 225-229.

*Primary Examiner* — Khamdan N. Alrobaie
(74) *Attorney, Agent, or Firm* — Wells St. John P.S.

(57) ABSTRACT

Some embodiments include memory cells having four transistors supported by a base, and vertically offset from the base. The four transistors are incorporated into first and second inverters having first and second inverter outputs, respectively. A first access transistor gatedly couples the first inverter output to a first comparative bitline, and second access transistor gatedly couples the second inverter output to a second comparative bitline. The first and second access transistors have first and second gates coupled to one another through a wordline. The four transistors are along a first side of the wordline, and are vertically displaced from the wordline. The first and second comparative bitlines are laterally adjacent to one another along a second side of the wordline, and are vertically displaced from the wordline. Some embodiments include memory arrays.

15 Claims, 7 Drawing Sheets

Related U.S. Application Data

(60) Provisional application No. 62/488,232, filed on Apr. 21, 2017.

(56) References Cited

U.S. PATENT DOCUMENTS

| | | |
|---|---|---|
| 6,301,148 B1 | 10/2001 | Violette |
| 6,304,483 B1 | 10/2001 | Noble |
| 6,503,790 B2 | 1/2003 | Noble, Jr. |
| 9,419,003 B1 | 8/2016 | Colinge |
| 10,157,928 B2* | 12/2018 | Colinge ............... H01L 27/1104 |
| 10,211,206 B1* | 2/2019 | Zang ...................... G11C 5/025 |
| 2004/0141352 A1* | 7/2004 | Dufourt ............... H01L 27/1104 365/72 |
| 2005/0079721 A1 | 4/2005 | Buerger |
| 2018/0061460 A1 | 3/2018 | Ingalls et al. |
| 2018/0061835 A1 | 3/2018 | Yang et al. |
| 2018/0061836 A1 | 3/2018 | Mathew et al. |

\* cited by examiner

MEMORY CELLS AND MEMORY ARRAYS

RELATED PATENT DATA

This patent resulted from a continuation of U.S. patent application Ser. No. 15/796,611, which was filed Oct. 27, 2017, and which is hereby incorporated herein by reference; which claims priority to U.S. Provisional Patent Application Ser. No. 62/488,232, which was filed Apr. 21, 2017.

TECHNICAL FIELD

Memory cells, such as memory cells having paired inverters (i.e., static memory cells). Memory arrays comprising static memory cells.

BACKGROUND

Memory has many uses in modern integrated circuitry. One known type of memory cell is a static memory cell, such as may be utilized in static random access memory (SRAM). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The operation of a static memory cell is in contrast to other types of memory cells, such as dynamic memory cells, which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, while static memory cells comprise many more transistors (for instance, some static memory cells comprise six transistors). Because of the significantly different architectural arrangements and functional requirements of static and dynamic memory cells and circuits, static memory design has developed along generally different paths than has the design of dynamic memories.

A static memory cell 10 is illustrated in FIG. 1. Static memory cell 10 generally comprises first and second inverters 12 and 14 which are cross-coupled to form a bistable flip-flop. Inverters 12 and 14 are formed by first and second n-channel pulldown (driver) transistors N1 and N2, and first and second p-channel pullup (load) transistors P1 and P2. The pulldown transistors may be referred to as pulldown devices (or driver devices), and the pullup transistors may be referred to as pullup devices (or load devices).

Driver transistors N1 and N2 have respective source regions 66 and 68 tied to a low reference or circuit supply voltage, labelled Vss, and typically referred to as "ground." Driver transistors N1 and N2 have respective drain regions 64 and 62, and respective gates 65 and 63. Load transistors P1 and P2 have respective source regions 78 and 80 tied to a high reference or circuit supply voltage, labelled Vcc, and have respective drain regions 70 and 72 tied to the drain regions 64 and 62, respectively, of the corresponding driver transistors N1 and N2. A gate 75 of the load transistor P1 is connected to the gate 65 of the driver transistor N1. A gate 73 of the load transistor P2 is connected to the gate 63 of the driver transistor N2.

Inverter 12 has an inverter output 20 from the drain region 64 of the driver transistor N1. Similarly, inverter 14 has an inverter output 22 from the drain region 62 of driver transistor N2. Inverter 12 has an inverter input 76 to the gate 65 of the driver transistor N1. Inverter 14 has an inverter input 74 to the gate 63 of the driver transistor N2.

The inputs and outputs of inverters 12 and 14 are cross-coupled to form a flip-flop having a pair of complementary two-state outputs. Specifically, inverter output 20 is coupled to inverter input 74 via a line 26, and inverter output 22 is coupled to inverter input 76 via a line 24. In this configuration, inverter outputs 20 and 22 form the complementary two-state outputs of the flip-flop.

A memory flip-flop, such as that described, typically forms one memory element of an integrated array of static memory elements. A plurality of access transistors, such as access transistors 30 and 32, are used to selectively address and access individual memory elements within the array. Access transistor 30 has one active terminal 58 (i.e., a source/drain region) connected to the cross-coupled inverter output 20. Access transistor 32 has one active terminal 60 (i.e., a source/drain region) connected to the cross-coupled inverter output 22. A pair of comparative bitlines 34 and 36 are connected to the remaining active terminals (i.e., the remaining source/drain regions) 56 and 54 of access transistors 30 and 32, respectively; and such comparative bitlines extend to circuitry 37 utilized for read/write operations associated with the static memory cell (such circuitry may comprise any suitable components, including, for example, logic, CMOS, a sense amplifier, drivers, etc.). A wordline 38 is connected to gates 31 and 33 of access transistors 30 and 32, respectively. In the illustrated embodiment, access transistors 30 and 32 would typically be n-channel transistors.

Reading static memory cell 10 requires activating wordline 38 to connect inverter outputs 20 and 22 to comparative bitlines 34 and 36. Writing to static memory cell 10 requires complementary logic voltage on comparative bitlines 34 and 36 with wordline 38 activated. This forces the outputs to the selected logic voltages, which will be maintained as long as power is supplied to the memory cell, or until the memory cell is reprogrammed.

In semiconductor processing, there is a continuing desire to make circuits denser, and to place components closer and closer together to reduce the size of circuits. It would be desirable to develop improved architectures for static memory which are suitable for utilization in highly integrated applications.

DETAILED DESCRIPTION OF THE ILLUSTRATED EMBODIMENTS

Some embodiments include static memory cells in which the various components are vertically arranged so that the static memory cells may be readily incorporated into highly integrated configurations. Example embodiments are described with reference to FIGS. 2-6.

Figure 2:
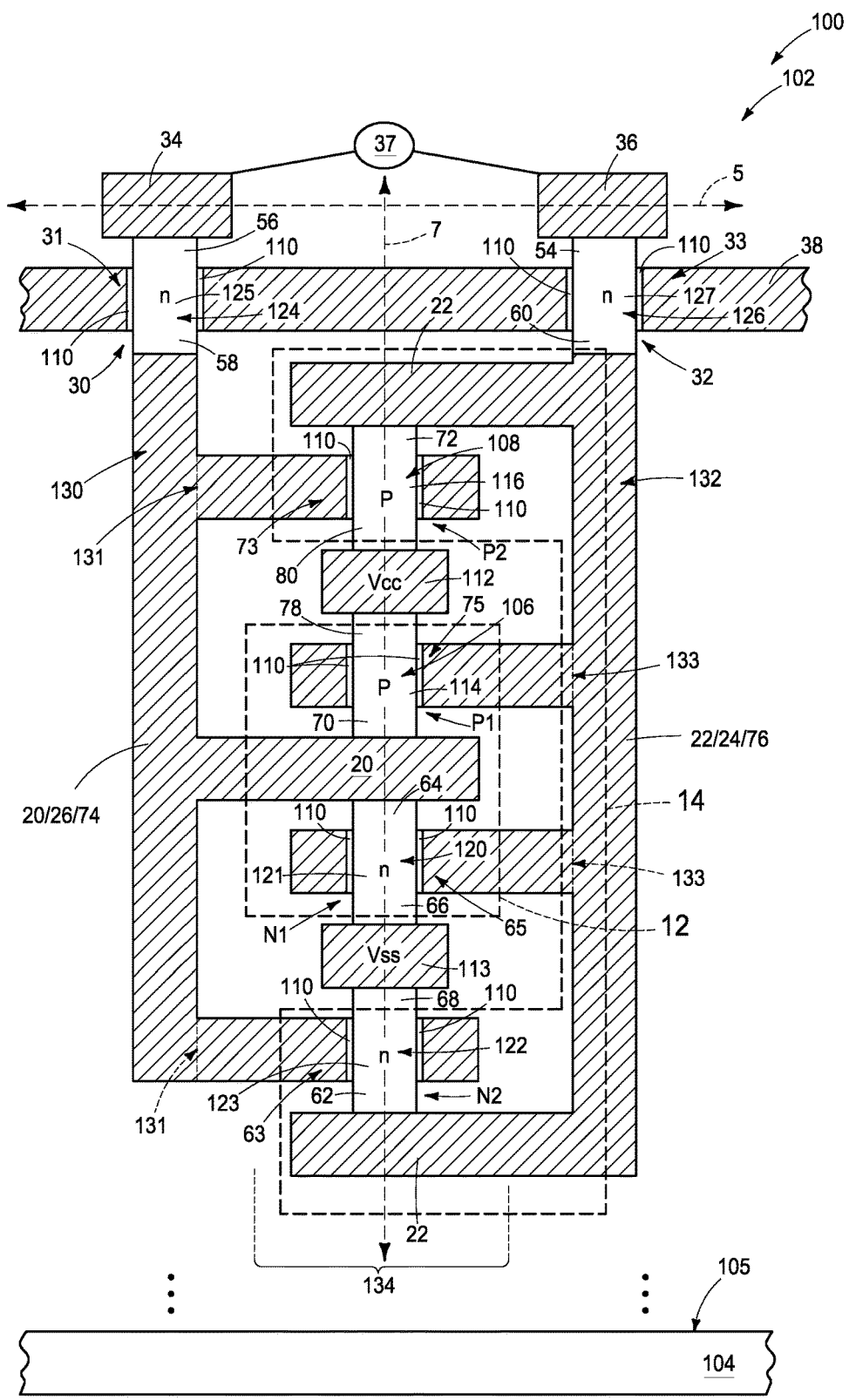
FIG. 2 is a diagrammatic cross-sectional side view of an example memory cell.

Referring to FIG. 2, an integrated construction 100 comprises an example static memory cell 102. The static memory cell 102 is supported by a base 104.

The base 104 may comprise semiconductor material; and may, for example, comprise, consist essentially of, or consist of monocrystalline silicon. The base 104 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 104 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 104 and the static memory cell 102 to indicate that there may be additional structures, components, materials, etc., provided between the memory cell 102 and the base 104. For instance, logic circuitry may be provided between the memory cell 102 and the base 104, with such logic circuitry being utilized during read/write operations associated with the static memory cell 102. In some embodiments, the gap between the memory cell 102 and the base 104 may be omitted, and the memory cell 102 may be formed directly against the base 104.

Figure 1:
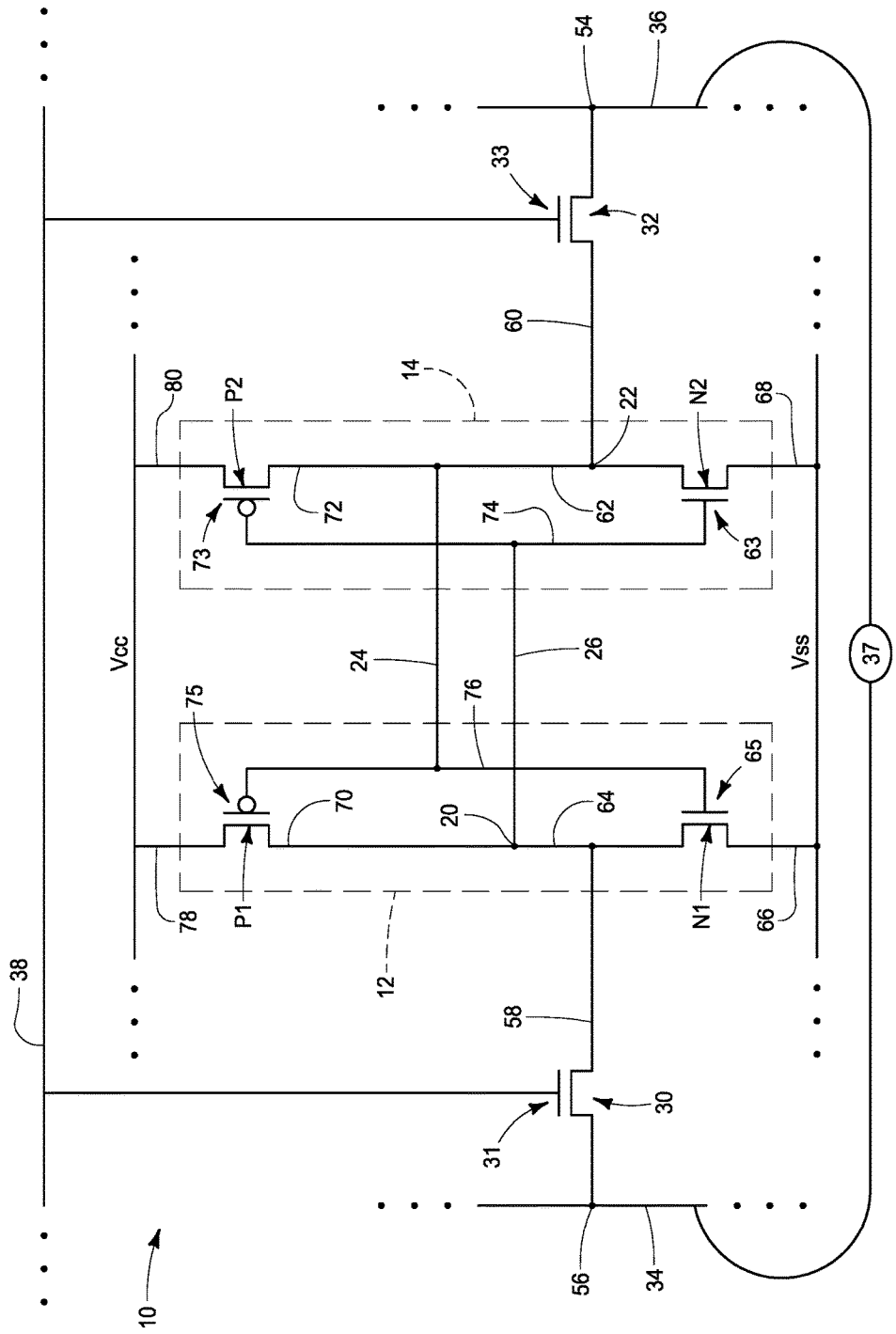
FIG. 1 is a circuit schematic of a prior art static memory cell.

The memory cell 102 comprises paired inverters 12 and 14 analogous to those described above with reference to FIG. 1. The inverter 12 includes the first p-channel transistor P1 and the first n-channel transistor N1; and the inverter 14 includes the second p-channel transistor P2 and the second n-channel transistor N2. Accordingly, the memory cell 102 includes four transistors P1, P2, N1 and N2 supported by the base 104, and vertically offset from the base. In the shown embodiment, the transistors are vertically stacked one atop another; with the second p-channel transistor P2 being over the first p-channel transistor P1, which is over the first n-channel transistor N1, which is over the second n-channel transistor N2.

The first p-channel transistor P1 has the first pullup gate 75 surrounding a first pillar 106. The first pillar 106 may comprise semiconductor material, such as, for example, silicon. The first pillar 106 is doped with p-type conductivity-enhancing dopant, and accordingly is labeled "p". The pullup gate 75 may comprise n-type doped semiconductor material (e.g., n-type doped silicon); and accordingly, the pullup gate 75 and pillar 106 may together form a nanowire-type transistor analogous to the transistors described in Colinge, et. al. (Nature Nanotechnology, Vol. 5, March 2010, pages 225-229). The pullup gate 75 is spaced from the pillar 106 by dielectric material 110. Such dielectric material may comprise any suitable composition or combination of compositions; and in some embodiments may comprise, consist essentially of, or consist of silicon dioxide. The dielectric material 110 may be referred to as gate dielectric.

The source/drain regions 70 and 78 of the first p-channel transistor P1 are within the semiconductor material of pillar 106. The source region 78 extends to a first reference voltage 112, which in the shown embodiment is labeled as VCC. The drain region 70 extends to an inverter output 20. The inverter output 20 may be referred to as a first inverter output to indicate that it is output from the first inverter 12. A channel region 114 is between the source/drain regions 70 and 78, and within the semiconductor material of pillar 106. In some embodiments, the channel region 114 may be referred to as a first channel region.

The second p-channel transistor P2 has the second pullup gate 73 surrounding a second pillar 108. The second pillar 108 may comprise the same semiconductor material as the first pillar 106; and may, for example, comprise silicon. The second pillar 108 is doped with p-type conductivity-enhancing dopant, and accordingly is labeled "p". The pullup gate 73 may comprise n-type doped semiconductor material (e.g., n-type doped silicon); and accordingly, the pullup gate 73 and pillar 108 may together form a nanowire-type transistor analogous to the transistors described in Colinge, et. al. The pullup gate 73 is spaced from the pillar 106 by dielectric material 110.

The source/drain regions 72 and 80 of the second p-channel transistor P2 are within the semiconductor material of pillar 108. The source region 80 extends to the first reference voltage 112. The drain region 72 extends to an inverter output 22. The inverter output 22 may be referred to as a second inverter output to indicate that it is output from the second inverter 14. A channel region 116 is between the source/drain regions 72 and 80, and within the semiconductor material of pillar 108. In some embodiments, the channel region 116 may be referred to as a second channel region.

The first n-channel transistor N1 has the first pulldown gate 65 surrounding a third pillar 120. The third pillar 120 may comprise the same semiconductor material as the first pillar 106; and may, for example, comprise silicon. The third pillar 120 is doped with n-type conductivity-enhancing dopant, and accordingly is labeled "n". The pulldown gate 65 may comprise p-type doped semiconductor material (e.g., p-type doped silicon); and accordingly, the pulldown gate 65 and pillar 120 may together form a nanowire-type transistor analogous to the transistors described in Colinge, et. al. The pulldown gate 65 is spaced from the pillar 120 by dielectric material 110.

The source/drain regions 64 and 66 of the first n-channel transistor N1 are within the semiconductor material of pillar 120. The source region 66 extends to a second reference voltage 113, which in the shown embodiment is labeled as VSS. The drain region 64 extends to the first inverter output 20. A channel region 121 is between the source/drain regions 64 and 66, and within the semiconductor material of pillar 120. In some embodiments, the channel region 121 may be referred to as a third channel region.

The second n-channel transistor N2 has the second pulldown gate 63 surrounding a fourth pillar 122. The fourth pillar 122 may comprise the same semiconductor material as the first pillar 106; and may, for example, comprise silicon. The fourth pillar 122 is doped with n-type conductivity-enhancing dopant, and accordingly is labeled "n". The pulldown gate 63 may comprise p-type doped semiconductor material (e.g., p-type doped silicon); and accordingly, the pulldown gate 63 and pillar 122 may together form a nanowire-type transistor analogous to the transistors described in Colinge, et. al. The pulldown gate 63 is spaced from the pillar 122 by dielectric material 110.

The source/drain regions 62 and 68 of the second n-channel transistor N2 are within the semiconductor material of pillar 122. The source region 68 extends to the second reference voltage 113. The drain region 62 extends to the second inverter output 22. A channel region 123 is between the source/drain regions 62 and 68, and within the semiconductor material of pillar 122. In some embodiments, the channel region 123 may be referred to as a fourth channel region.

The first and second reference voltages 112 and 113 may be any suitable reference voltages; with the first reference voltage 112 typically being higher than the second reference voltage 113. In some embodiments, the first reference voltage 112 may be considered to be along a first circuit supply line (e.g., a VCC line), and the second reference voltage 113 may be considered to be along a second circuit supply line (e.g., a VSS line); with the first and second circuit supply lines extending in and out of the page relative to the cross-sectional view of FIG. 2. The first circuit supply line (the illustrated VCC line) is vertically between the first and second p-channel transistors P1 and P2; and the second circuit supply line (the illustrated VSS line) is vertically between the first and second n-channel transistors N1 and N2.

In the embodiment of FIG. 2, all four of the transistors P1, P2, N1 and N2 are vertically stacked one atop another; and the first, second, third and fourth vertically-extending pillars 106, 108, 120 and 122 are aligned with one another along a vertical axis 7. Such vertical axis may extend orthogonally relative to a horizontal plane defined by an upper surface 105 of base 104 in some embodiments (as shown); and in other embodiments may be tilted to be at an angle other than 90° relative to the horizontal plane defined by the upper surface 105 of base 104.

In the embodiment of FIG. 2, both of the p-channel transistors P1 and P2 are over both of the n-channel transistors N1 and N2. In other embodiments, the p-channel transistors may be laterally offset relative to the n-channel transistors (as described in more detail below relative to an embodiment of FIG. 4).

The memory cell 102 may be part of a memory array, and may be uniquely addressed utilizing a wordline 38, and a pair of comparative bitlines 34 and 36. In the illustrated embodiment of FIG. 2, the wordline 38 is vertically offset from the transistors P1, P2, N1 and N2; and is shown to be above such transistors. The comparative bitlines 34 and 36 are vertically offset from the wordline 38, and are shown to be above the wordline 38.

The wordline 38 is coupled with the gates 31 and 33 of the access transistors 30 and 32. In the shown embodiment, vertical pillars 124 and 126 extend through the access transistors 30 and 32, respectively; and comprise channel regions 125 and 127 of the access transistors 30 and 32, respectively. The pillars 124 and 126 may comprise semiconductor material, and in some embodiments may comprise the same semiconductor material as the pillars 106, 108, 120 and 122 of the transistors P1, P2, N1 and N2. For instance, the pillars 124 and 126 may comprise silicon. In the shown embodiment, the pillars 124 and 126 are doped with n-type conductivity-enhancing dopant, and accordingly are labeled "n". The gates 31 and 33 may comprise p-type doped semiconductor material (e.g., p-type doped silicon); and accordingly, the access transistors 30 and 32 may correspond to nanowire-type transistors analogous to the transistors described in Colinge, et. al.

The channel regions 125 and 127 are spaced from the gates 31 and 33, respectively, by dielectric material 110.

The access transistor 30 includes a source/drain region 56 coupled with the comparative bitline 34, and another source/drain region 58 coupled with a first vertically-extending interconnect structure 130. The access transistor 32 includes a source/drain region 54 coupled with the comparative bitline 36, and another source/drain region 60 coupled with a second vertically-extending interconnect structure 132.

The first vertically-extending interconnect structure 130 may be coupled with, or include, the first inverter output 20, the inverter input 74 (discussed above relative to FIG. 1), and the connection 26 between the inverter output 20 and the inverter input 74 (with the connection 26 being discussed above relative to FIG. 1); and accordingly, is also labeled 20/26/74. The pullup gate 73 of load transistor P2 and the pulldown gate 63 of driver transistor N2 are coupled with the first vertically-extending interconnect structure 130.

The first vertically-extending interconnect structure 130 may comprise any suitable composition or combination of compositions, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first vertically-extending interconnect structure 130 may comprise a different composition than the gates 63 and 73, and dashed lines 131 are provided to diagrammatically illustrate an optional change in composition between the vertically-extending interconnect 130 and the horizontally-extending lines comprising gates 63 and 73. For instance, in some embodiments the vertically-extending interconnect structure 130 may comprise, consist essentially of, or consist of metal (e.g., tungsten, titanium, etc.) and/or metal-containing material (e.g., metal silicide, metal nitride, etc.; such as, for example, tungsten nitride, titanium nitride, tungsten silicide, titanium silicide, etc.), and the gates 63 and 73 may comprise appropriately-doped semiconductor material (e.g., appropriately-doped silicon). The horizontally-extending segment comprising the first inverter output 20 (i.e., the horizontally-extending segment between the pullup transistor P1 and the pulldown transistor N1) may comprise a same composition as the vertically-extending interconnect 130 in some embodiments (as shown), and in other embodiments may comprise a different conductive composition than the vertically-extending interconnect 130.

The second vertically-extending interconnect structure 132 may be coupled with, or include, the second inverter output 22, the inverter input 76 (discussed above relative to FIG. 1), and the connection 24 between the inverter output 22 and the inverter input 76 (with the connection 24 also being discussed above relative to FIG. 1); and accordingly, is also labeled 22/24/76. The pullup gate 75 of load transistor P1 and the pulldown gate 65 of driver transistor N1 are coupled with the second vertically-extending interconnect structure 132.

The second vertically-extending interconnect structure 132 may comprise any suitable composition or combination of compositions, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the second vertically-extending interconnect structure 132 may comprise a different composition than the gates 65 and 75, and dashed lines 133 are provided to diagrammatically illustrate an optional change in composition between the vertically-extending interconnect 132 and the horizontally-extending lines comprising gates 65 and 75. For instance, in some embodiments the vertically-extending interconnect structure 132 may comprise, consist essentially of, or consist of metal (e.g., tungsten, titanium, etc.) and/or metal-containing material (e.g., metal silicide, metal nitride, etc.; such as, for example, tungsten nitride, titanium nitride, tungsten silicide, titanium silicide, etc.), and the gates 65 and 75 may comprise appropriately-doped semiconductor material (e.g., appropriately-doped silicon). The horizontally-extending segments comprising the second inverter output 22 (i.e., the horizontally-extending segment above the pullup transistor P2, and the horizontally-extending segment below the pulldown transistor N2) may comprise a same composition as the vertically-extending interconnect 132 in some embodiments (as shown), and in other embodiments may comprise a different conductive composition than the vertically-extending interconnect 132.

The first and second vertically-extending interconnects 130 and 132 may comprise a same composition as one another in some embodiments; and may comprise different compositions relative to one another in other embodiments.

The first vertically-extending interconnect 130 is laterally offset from the second vertically-extending interconnect 132; with the first and second vertically-extending interconnects 130 and 132 being spaced from one another by an intervening region 134 comprising the four transistors P1, P2, N1, and N2.

The first access transistor 30 couples the first inverter output 20 to the first comparative bitline 34, and the second access transistor 32 couples the second inverter output 22 to the second comparative bitline 36. The comparative bitline 34 and 36 extend to the circuitry 37 utilized for reading/writing relative to the memory cell 102. The wordline 38 also extends to circuitry (not shown) associated with reading/writing relative to the memory cell 102.

In the shown embodiment, the first and second comparative bitlines 34 and 36 are laterally adjacent to one another, and along a same horizontal plane as one another (i.e., are along a common horizontal axis 5). The first and second comparative bitlines 34 and 36 are on an opposing side of the wordline 38 from the four transistors P1, P2, N1, and N2.

The various structures of FIG. 2 may be surrounded by insulative material (not shown); such as, for example, one or more of silicon dioxide, silicon nitride, etc.

Figure 3:
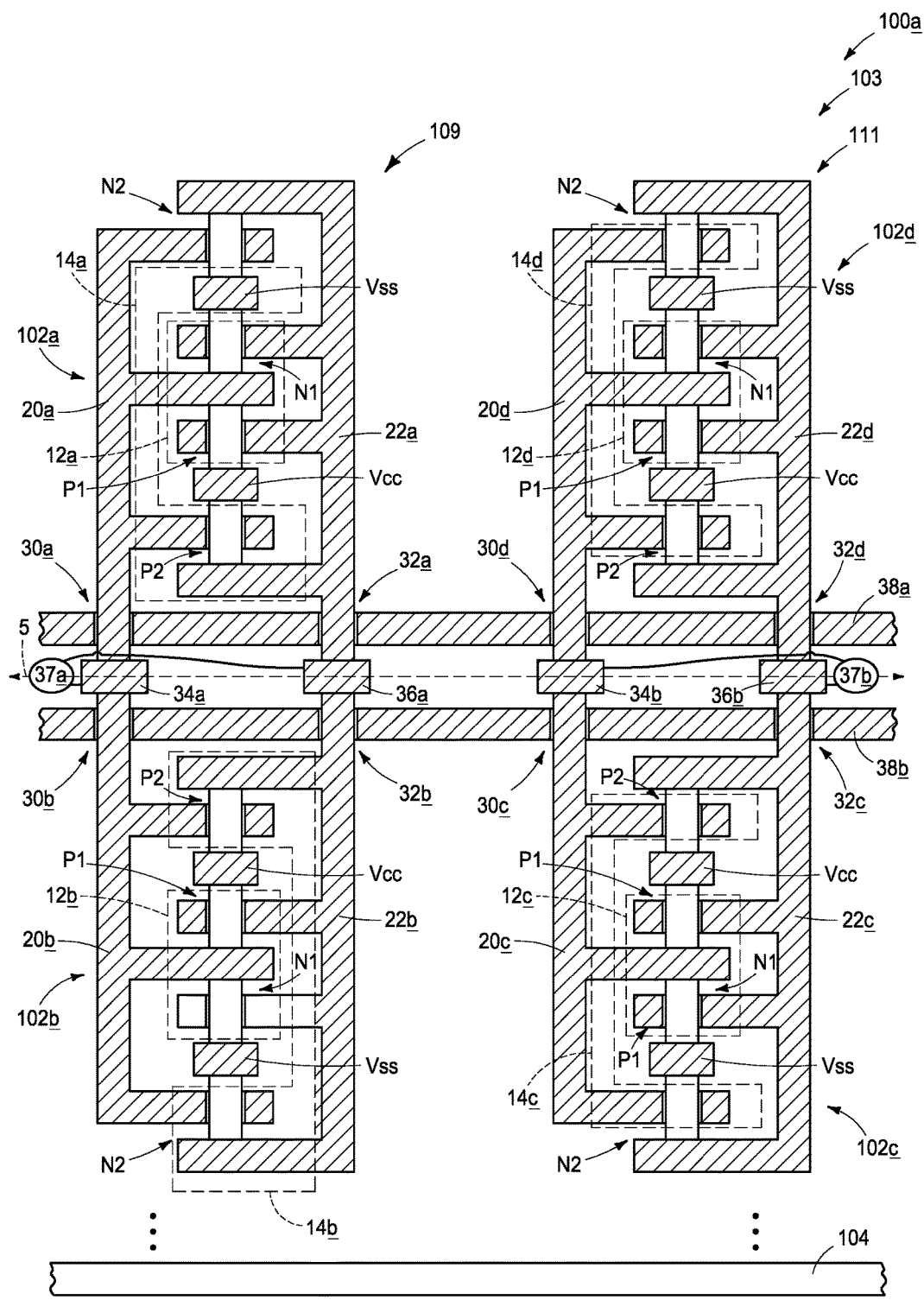
FIG. 3 is a diagrammatic cross-sectional side view of a region of an example memory array.

The memory cell 102 may be an example of one of many substantially identical memory cells incorporated into a memory array; with the term "substantially identical" meaning identical to within reasonable tolerances of fabrication and measurement. FIG. 3 shows a construction 100a comprising a plurality of substantially identical memory cells 102a, 102b, 102c and 102d within a portion of an example memory array 103.

The memory array 103 comprises rows and columns; with wordlines extending along the rows and bitlines extending along the columns. The bitlines along the columns comprise paired first and second comparative bitlines. Each memory cell of the memory array 103 is uniquely addressed by a wordline in combination with a pair of comparative bitlines.

A pair of example wordlines 38a and 38b are shown in FIG. 3, with the wordlines 38a and 38b extending along rows which are parallel to the plane of the cross-sectional view of FIG. 3 (i.e., which are along the page relative to the cross-sectional view of FIG. 3). Two example pairs of comparative bitlines are shown in FIG. 3; with one pair comprising comparative bitlines 34a and 36a, and the other pair comprising comparative bitlines 34b and 36b. The bitlines 34a, 34b, 36a and 36b extend along columns which are orthogonal to the cross-sectional view of FIG. 3 (i.e., which extend in and out of the page relative to the cross-sectional view of FIG. 3).

The bitlines 34a and 36a are coupled with first circuitry 37a (e.g., sense amplifier circuitry, logic circuitry, CMOS circuitry, driver circuitry, etc.), and the bitlines 34b and 36b are coupled with second circuitry 37b (e.g., sense amplifier circuitry, logic circuitry, CMOS circuitry, driver circuitry, etc.). In some embodiments, the first and second circuitries 37a and 37b may be associated with a common region along base 104.

A horizontal axis 5 is provided to extend through the comparative bitlines 34a, 34b, 36a and 36b. Such axis may be considered to define a mirror plane. The memory cells above such mirror plane share comparative bitlines with the memory cells below the mirror plane, and are substantially mirror images of the memory cells below the mirror plane; with the term "substantially mirror image" meaning that the indicated memory cells are mirror images of one another to within reasonable tolerances of fabrication and measurement. Specifically, the memory cell 102a shares the comparative bitlines 34a and 36a with the memory cell 102b, and is substantially a mirror image of the memory cell 102b; and the memory cell 102d shares the comparative bitlines 34b and 36b with the memory cell 102c, and is substantially a mirror image of the memory cell 102c.

In some embodiments, each of the memory cells 102a, 102b, 102c and 102d may be considered to comprise two p-channel transistors (P1 and P2), and two n-channel transistors (N1 and N2). The p-channel transistors and n-channel transistors are arranged within first inverters (12a, 12b, 12c, 12d) and second inverters (14a, 14b, 14c, 14d); with the first and second inverters having first and second inverter outputs (20a, 22a, 20b, 22b, 20c, 22c, 20d, 22d). Each of the memory cells 102a, 102b, 102c and 102d has a first access gate (30a, 30b, 30c, 30d) gatedly coupling the first inverter output (20a, 20b, 20c, 20d) with a first comparative bitline (34a, 34b) of the pair of comparative bitlines. Each of the memory cells 102a, 102b, 102c and 102d also has a second access gate (32a, 32b, 32c, 32d) gatedly coupling the second inverter output (22a, 22b, 22c, 22d) with a second comparative bitline (36a, 36b) of the pair of comparative bitlines. The first and second access transistors (30a, 32a, 30b, 32b, 30c, 32c, 30d, 32d) have gate electrodes (analogous to the gate electrodes 31 and 33 described above with reference to FIG. 2) coupled with the wordlines (38a, 38b).

Each of the memory cells 102a, 102b, 102c and 102d is uniquely addressed utilizing a pair of comparative bitlines (34a/36a or 34b/36b) and a wordline (38a or 38b).

In some embodiments, the memory cell 102a may be referred to as a first memory cell; with such first memory cell being uniquely addressed utilizing the first wordline 38a and the paired comparative bitlines 34a/36a. The memory cell 102b may be referred to as a second memory cell which is vertically stacked relative to the first memory cell 102a, and which shares the paired comparative bitlines 34a/36a. The second memory cell 102b is uniquely addressed utilizing the second wordline 38b in combination with the paired comparative bitlines 34a/36a.

In some embodiments, the stacked memory cells 102a/102b may be referred to as a first set 109 of stacked memory cells. The memory cells 102c and 102d may be considered to be third and fourth memory cells, respectively, which are laterally adjacent to the first and second memory cells 102a and 102b; and which form a second set 111 of stacked memory cells. The second set 111 of stacked memory cells is laterally displaced from the first set 109 of stacked memory cells along the wordlines 38a and 38b.

The various structures of FIG. 3 may be surrounded by insulative material (not shown); such as, for example, one or more of silicon dioxide, silicon nitride, etc.

Figure 4:
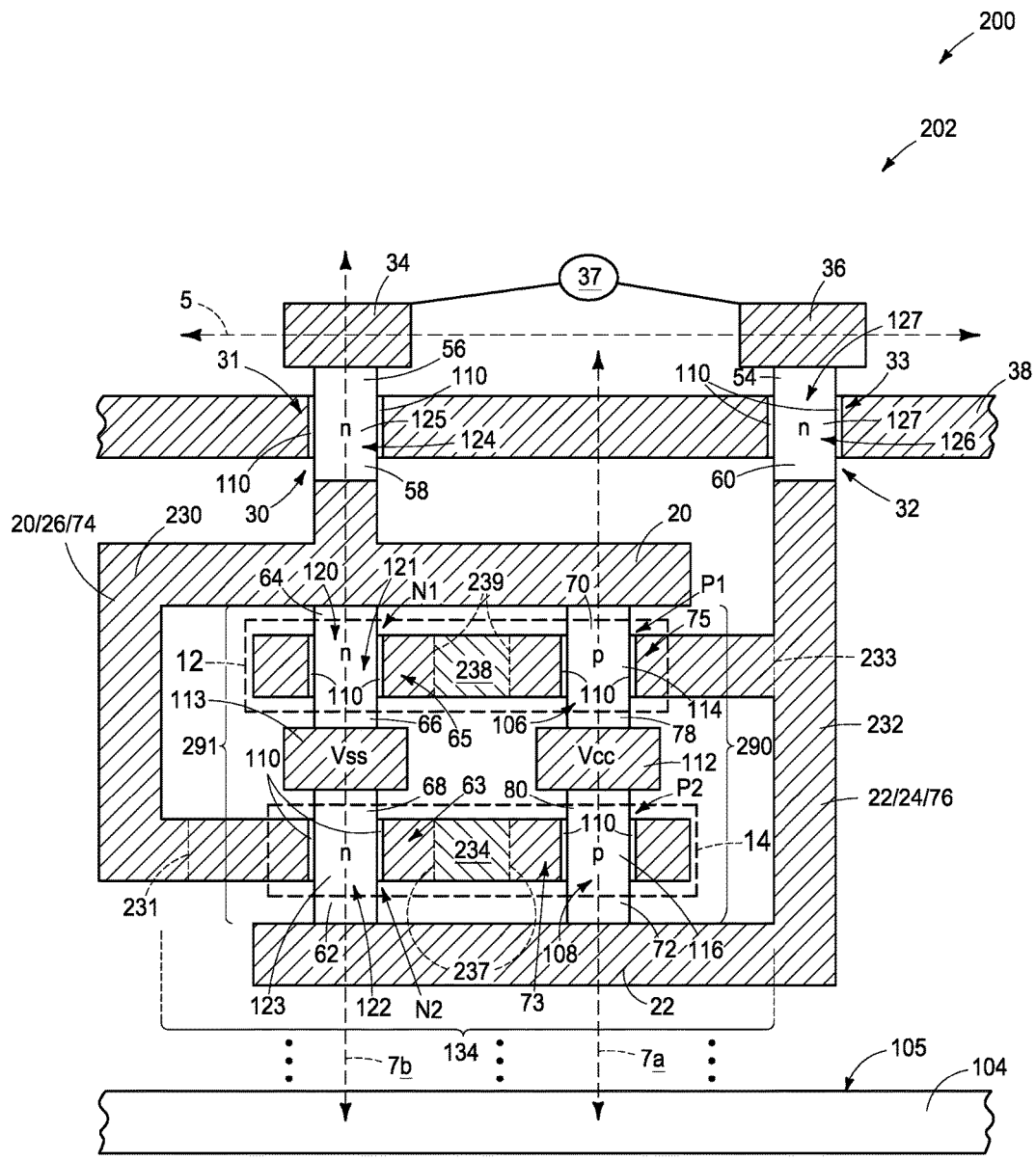
FIG. 4 is a diagrammatic cross-sectional side view of an example memory cell.

FIG. 4 shows an integrated construction 200 comprising another example static memory cell 202. The static memory cell 202 is supported by the base 104.

The gap is provided between the base 104 and the static memory cell 202 to indicate that there may be additional structures, components, materials, etc., provided between the memory cell 202 and the base 104. In some embodiments, the gap between the memory cell 202 and the base 104 may be omitted, and the memory cell 202 may be formed directly against the base 104.

The memory cell 202 comprises paired inverters 12 and 14 analogous to those described above with reference to FIG. 1. The inverter 12 includes the first p-channel transistor P1 and the first n-channel transistor N1; and the inverter 14 includes the second p-channel transistor P2 and the second n-channel transistor N2. Accordingly, the memory cell 202 includes four transistors (P1, P2, N1 and N2) supported by the base 104, and vertically offset from the base. In the shown embodiment, the p-channel transistors (P1 and P2) are vertically stacked one atop another and comprised by a first stack 290; and the n-channel transistors (N1 and N2) are vertically stacked one atop another and comprised by a second stack 291. The second stack 291 is laterally displaced relative to the first stack 290, and in the shown embodiment is horizontally aligned with the first stack.

The first p-channel transistor P1 has the first pullup gate 75 surrounding the first pillar 106. The pullup gate 75 is spaced from the pillar 106 by the dielectric material 110. The source/drain regions 70 and 78 of the first p-channel transistor P1 are within the semiconductor material of pillar 106. The source region 78 extends to the first reference voltage 112, which in the shown embodiment is labeled as VCC. The drain region 70 extends to the first inverter output 20. The first channel region 114 is between the source/drain regions 70 and 78, and within the semiconductor material of pillar 106.

The second p-channel transistor P2 has the second pullup gate 73 surrounding the second pillar 108. The pullup gate 73 is spaced from the pillar 106 by the dielectric material 110. The source/drain regions 72 and 80 of the second p-channel transistor P2 are within the semiconductor material of pillar 108. The source region 80 extends to the first reference voltage 112. The drain region 72 extends to the second inverter output 22. The second channel region 116 is between the source/drain regions 72 and 80, and within the semiconductor material of pillar 108.

The first n-channel transistor N1 has the first pulldown gate 65 surrounding the third pillar 120. The pulldown gate 65 is spaced from the pillar 120 by the dielectric material 110.

The source/drain regions 64 and 66 of the first n-channel transistor N1 are within the semiconductor material of pillar 120. The source region 66 extends to the second reference voltage 113, which in the shown embodiment is labeled as VSS. The drain region 64 extends to the first inverter output 20. The third channel region 121 is between the source/drain regions 64 and 66, and within the semiconductor material of pillar 120.

The second n-channel transistor N2 has the second pulldown gate 63 surrounding the fourth pillar 122. The source/drain regions 62 and 68 of the second n-channel transistor N2 are within the semiconductor material of pillar 122. The source region 68 extends to the second reference voltage 113. The drain region 62 extends to the second inverter output 22. The fourth channel region 123 is between the source/drain regions 62 and 68, and within the semiconductor material of pillar 122.

The pillars 106, 108, 120 and 122, and gates 73, 75, 63 and 65 of the embodiment of FIG. 4 may comprise the same materials described above relative to the embodiment of FIG. 2.

The first and second reference voltages 112 and 113 may be any suitable reference voltages; with the first reference voltage 112 typically being higher than the second reference voltage 113. The first reference voltage 112 may be along a first circuit supply line (e.g., a VCC line), and the second reference voltage 113 may be along a second circuit supply line (e.g., a VSS line); with the first and second circuit supply lines extending in and out of the page relative to the cross-sectional view of FIG. 4. The first circuit supply line (the illustrated VCC line) is vertically between the first and second p-channel transistors (P1 and P2); and the second circuit supply line (the illustrated VSS line) is vertically between the first and second n-channel transistors (N1 and N2).

In the embodiment of FIG. 4, the transistors P1 and P2 are vertically stacked one atop another, and the transistors N1 and N2 are vertically stacked one atop another. The first and second vertically-extending pillars 106 and 108 are aligned with one another along a first vertical axis 7a; and the third and fourth vertically-extending pillars 120 and 122 are aligned with one another along a second vertical axis 7b. The vertical axis 7b is laterally offset from the vertical axis 7a.

The vertical axes 7a and 7b may extend orthogonally relative to a horizontal plane defined by an upper surface 105 of base 104 in some embodiments (as shown); and in other embodiments may be tilted to be at an angle other than 90° relative to the horizontal plane defined by the upper surface 105 of base 104. The vertical axes 7a and 7b may be parallel to one another in some embodiments (as shown), and may be not parallel to one another in other embodiments.

The memory cell 202 may be part of a memory array, and may be uniquely addressed utilizing the wordline 38, and the pair of comparative bitlines 34 and 36. In the illustrated embodiment of FIG. 4, the wordline 38 is vertically offset from the transistors P1, P2, N1 and N2; and is shown to be above such transistors. The comparative bitlines 36 and 37 are vertically offset from the wordline 38, and are shown to be above the wordline 38.

The wordline 38 is coupled with the gates 31 and 33 of the access transistors 30 and 32. In the shown embodiment, the vertical pillars 124 and 126 extend through the access transistors 30 and 32, respectively; and comprise channel regions 125 and 127 of the access transistors 30 and 32, respectively. The channel regions 125 and 127 are spaced from the gates 31 and 33, respectively, by dielectric material 110.

The access transistor 30 includes a source/drain region 56 coupled with the comparative bitline 34, and another source/drain region 58 coupled with a first vertically-extending interconnect structure 230. The access transistor 32 includes a source/drain region 54 coupled with the comparative bitline 36, and another source/drain region 60 coupled with a second vertically-extending interconnect structure 232.

The first vertically-extending interconnect structure 230 is coupled with, or includes, the first inverter output 20, the inverter input 74, and the connection 26 between the inverter output 20 and the inverter input 74; and accordingly, is also labeled 20/26/74. The pullup gate 73 of load transistor P2 and the pulldown gate 63 of driver transistor N2 are coupled with the first vertically-extending interconnect structure 230.

The first vertically-extending interconnect structure 230 may comprise any suitable composition or combination of compositions, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first vertically-extending interconnect structure 230 may comprise a different composition than the gates 63 and 73, and a dashed line 231 is provided to diagrammatically illustrate an optional change in composition between the vertically-extending interconnect 230 and the horizontally-extending lines comprising gates 63 and 73. For instance, in some embodiments the vertically-extending interconnect structure 230 may comprise, consist essentially of, or consist of metal (e.g., tungsten, titanium, etc.) and/or metal-containing material (e.g., metal silicide, metal nitride, etc.; such as, for example, tungsten nitride, titanium nitride, tungsten silicide, titanium silicide, etc.), and the gates 63 and 73 may comprise appropriately-doped semiconductor material (e.g., appropriately-doped silicon). The horizontally-extending segment comprising the first inverter output 20 (i.e., the horizontally-extending segment above the pullup transistor P1 and the pulldown transistor N1) may comprise a same composition as the vertically-extending interconnect 230 in some embodiments (as shown), and in other embodiments may comprise a different conductive composition than the vertically-extending interconnect 230.

A region 234 between the gate 73 of the P2 transistor and the gate 63 of the N2 transistor may comprise metal or metal-containing material to bridge between the p-type gate material of the n-channel device and the n-type gate material of the p-channel device. Dashed lines 237 are provided along the edges of region 234 to diagrammatically illustrate a change in composition occurring along interfaces of region 234 with the gates 63 and 73.

The second vertically-extending interconnect structure 232 is coupled with, or includes, the second inverter output 22, the inverter input 76, and the connection 24 between the inverter output 22 and the inverter input 76; and accordingly, is also labeled 22/24/76. The pullup gate 75 of load transistor P1 and the pulldown gate 65 of driver transistor N1 are coupled with the second vertically-extending interconnect structure 232.

The second vertically-extending interconnect structure 232 may comprise any suitable composition or combination of compositions, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the second vertically-extending interconnect structure 232 may comprise a different composition than the gates 65 and 75, and a dashed line 233 is provided to diagrammatically illustrate an optional change in composition between the vertically-extending interconnect 232 and the horizontally-extending line comprising gates 65 and 75. For instance, in some embodiments the vertically-extending interconnect structure 232 may comprise, consist essentially of, or consist of metal (e.g., tungsten, titanium, etc.) and/or metal-containing material (e.g., metal silicide, metal nitride, etc.; such as, for example, tungsten nitride, titanium nitride, tungsten silicide, titanium silicide, etc.), and the gates 65 and 75 may comprise appropriately-doped semiconductor material (e.g., appropriately-doped silicon). The horizontally-extending segment comprising the second inverter output 22 (i.e., the horizontally-extending segment beneath the pullup transistor P2 and the pulldown transistor N2) may comprise a same composition as the vertically-extending interconnect 232 in some embodiments (as shown), and in other embodiments may comprise a different conductive composition than the vertically-extending interconnect 232.

A region 238 between the gate 75 of the P1 transistor and the gate 65 of the N1 transistor may comprise metal or metal-containing material to bridge between the p-type gate material of the n-channel device and the n-type gate material of the p-channel device. Dashed lines 239 are provided along the edges of region 238 to diagrammatically illustrate a change in composition occurring along interfaces of region 238 with the gates 65 and 75.

The first and second vertically-extending interconnects 230 and 232 may comprise a same composition as one another in some embodiments; and may comprise different compositions relative to one another in other embodiments.

The first vertically-extending interconnect 230 is laterally offset from the second vertically-extending interconnect 232; with the first and second vertically-extending interconnects 230 and 232 being spaced from one another by an intervening region 134 comprising the four transistors P1, P2, N1, and N2.

The first access transistor 30 couples the first inverter output 20 to the first comparative bitline 34, and the second access transistor 32 couples the second inverter output 22 to the second comparative bitline 36. The comparative bitlines 34 and 36 extend to the circuitry 37 utilized for reading/writing relative to the memory cell 202. The wordline 38 also extends to circuitry (not shown) associated with reading/writing relative to the memory cell 202.

In the shown embodiment, the first and second comparative bitlines 34 and 36 are laterally adjacent to one another, and along a same horizontal plane as one another (i.e., are along a common horizontal axis 5). The first and second comparative bitlines 34 and 36 are on an opposing side of the wordline 38 from the four transistors P1, P2, N1, and N2.

The various structures of FIG. 4 may be surrounded by insulative material (not shown); such as, for example, one or more of silicon dioxide, silicon nitride, etc.

Figure 5:
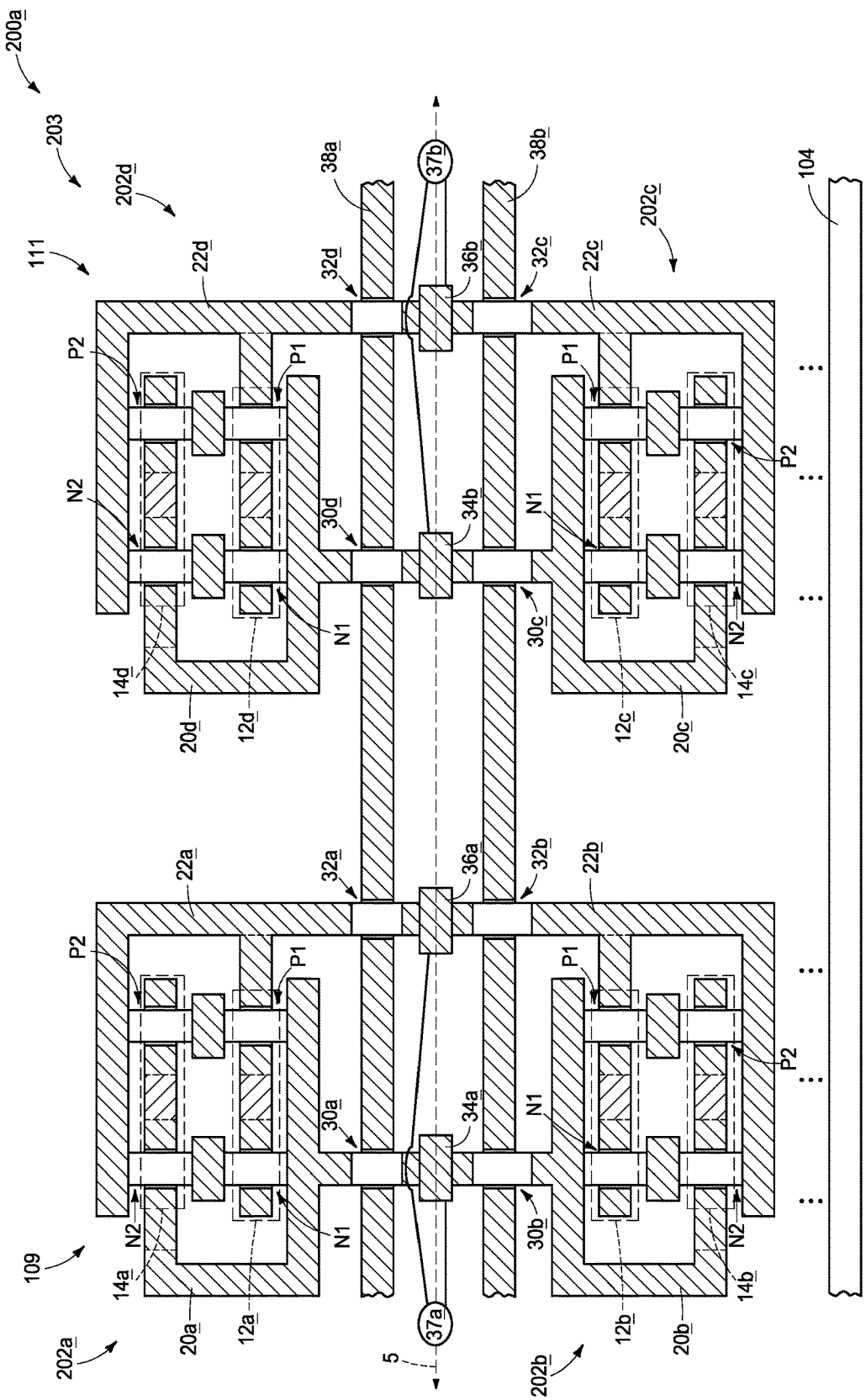
FIG. 5 is a diagrammatic cross-sectional side view of a region of an example memory array.

The memory cell 202 may be an example of one of many substantially identical memory cells incorporated into a memory array. FIG. 5 shows a construction 200a comprising a plurality of substantially identical memory cells 202a, 202b, 202c and 202d within a portion of an example memory array 203.

The memory array 203 comprises rows and columns; with wordlines extending along the rows and bitlines extending along the columns. The bitlines along the columns comprise paired first and second comparative bitlines. Each memory cell of the memory array 203 is uniquely addressed by a wordline in combination with a pair of comparative bitlines.

A pair of example wordlines 38a and 38b are shown in FIG. 5, with the wordlines 38a and 38b extending along rows which are parallel to the plane of the cross-sectional view of FIG. 5 (i.e., which are along the page relative to the cross-sectional view of FIG. 5). Two example pairs of comparative bitlines are shown in FIG. 5; with one pair comprising comparative bitlines 34a and 36a, and the other pair comprising comparative bitlines 34b and 36b. The bitlines 34a, 34b, 36a and 36b extend along columns which are orthogonal to the cross-sectional view of FIG. 5 (i.e., which extend in and out of the page relative to the cross-sectional view of FIG. 5).

The bitlines 34a and 36a are coupled with first circuitry 37a (e.g., sense amplifier circuitry, logic circuitry, CMOS circuitry, driver circuitry, etc.), and the bitlines 34b and 36b are coupled with second circuitry 37b (e.g., sense amplifier circuitry, logic circuitry, CMOS circuitry, driver circuitry, etc.). In some embodiments, the first and second circuitries 37a and 37b may be associated with a common region along base 104.

A horizontal axis 5 is provided to extend through the comparative bitlines 34a, 34b, 36a and 36b. Such axis may be considered to define a mirror plane. The memory cells above such mirror plane share comparative bitlines with the memory cells below the mirror plane, and are substantially mirror images of the memory cells below the mirror plane. Specifically, the memory cell 202a shares the comparative bitlines 34a and 36a with the memory cell 202b, and is substantially a mirror image of the memory cell 202b; and the memory cell 202d shares the comparative bitlines 34b and 36b within the memory cell 202c, and is substantially a mirror image of the memory cell 202c.

In some embodiments, each of the memory cells 202a, 202b, 202c and 202d may be considered to comprise two p-channel transistors (P1 and P2), and two n-channel transistors (N1 and N2). The p-channel transistors and n-channel transistors are arranged within first inverters (12a, 12b, 12c, 12d) and second inverters (14a, 14b, 14c, 14d); with the first and second inverters having first and second inverter outputs (20a, 22a, 20b, 22b, 20c, 22c, 20d, 22d). Each of the memory cells 202a, 202b, 202c and 202d has a first access gate (30a, 30b, 30c, 30d) gatedly coupling the first inverter output (20a, 20b, 20c, 20d) with a first comparative bitline (34a, 34b) of the pair of comparative bitlines. Each of the memory cells 202a, 202b, 202c and 202d also has a second access gate (32a, 32b, 32c, 32d) gatedly coupling the second inverter output (22a, 22b, 22c, 22d) with a second comparative bitline (36a, 36b) of the pair of comparative bitlines. The first and second access transistors (30a, 32a, 30b, 32b, 30c, 32c, 30d, 32d) have gate electrodes (analogous to the gate electrodes 31 and 33 described above with reference to FIG. 4) coupled with the wordlines (38a, 38b).

Each of the memory cells 202a, 202b, 202c and 202d is uniquely addressed utilizing a pair of comparative bitlines (34a/36a or 34b/36b) and a wordline (38a or 38b).

In some embodiments, the memory cell 202a may be referred to as a first memory cell; with such first memory cell being uniquely addressed utilizing the first wordline 38a and the paired comparative bitlines 34a/36a. The memory cell 202b may be referred to as a second memory cell which is vertically stacked relative to the first memory cell 202a, and which shares the paired comparative bitlines 34a/36a. The second memory cell 202b is uniquely addressed utilizing the second wordline 38b in combination with the paired comparative bitlines 34a/36a.

In some embodiments, the stacked memory cells 202a/202b may be referred to as a first set 109 of stacked memory cells.

The memory cells 202c and 202d may be considered to be third and fourth memory cells, respectively, which are laterally adjacent to the first and second memory cells 202a and 202b; and which form a second set 111 of stacked memory cells.

The second set 111 of stacked memory cells is laterally displaced from the first set 109 of stacked memory cells along the wordlines 38a and 38b.

The various structures of FIG. 5 may be surrounded by insulative material (not shown); such as, for example, one or more of silicon dioxide, silicon nitride, etc.

The memory cells described in FIGS. 2-5 are example memory cells, and in some applications may be modified to replace them with other suitable static memory. For instance, in some embodiments at least one of the pullup devices (load devices) shown as p-channel transistors in FIGS. 2-5 may be replaced with one or more resistors (with example resistors being conductive structures (e.g., wires) having suitable low conductivity to provide desired resistance).

Figure 6:
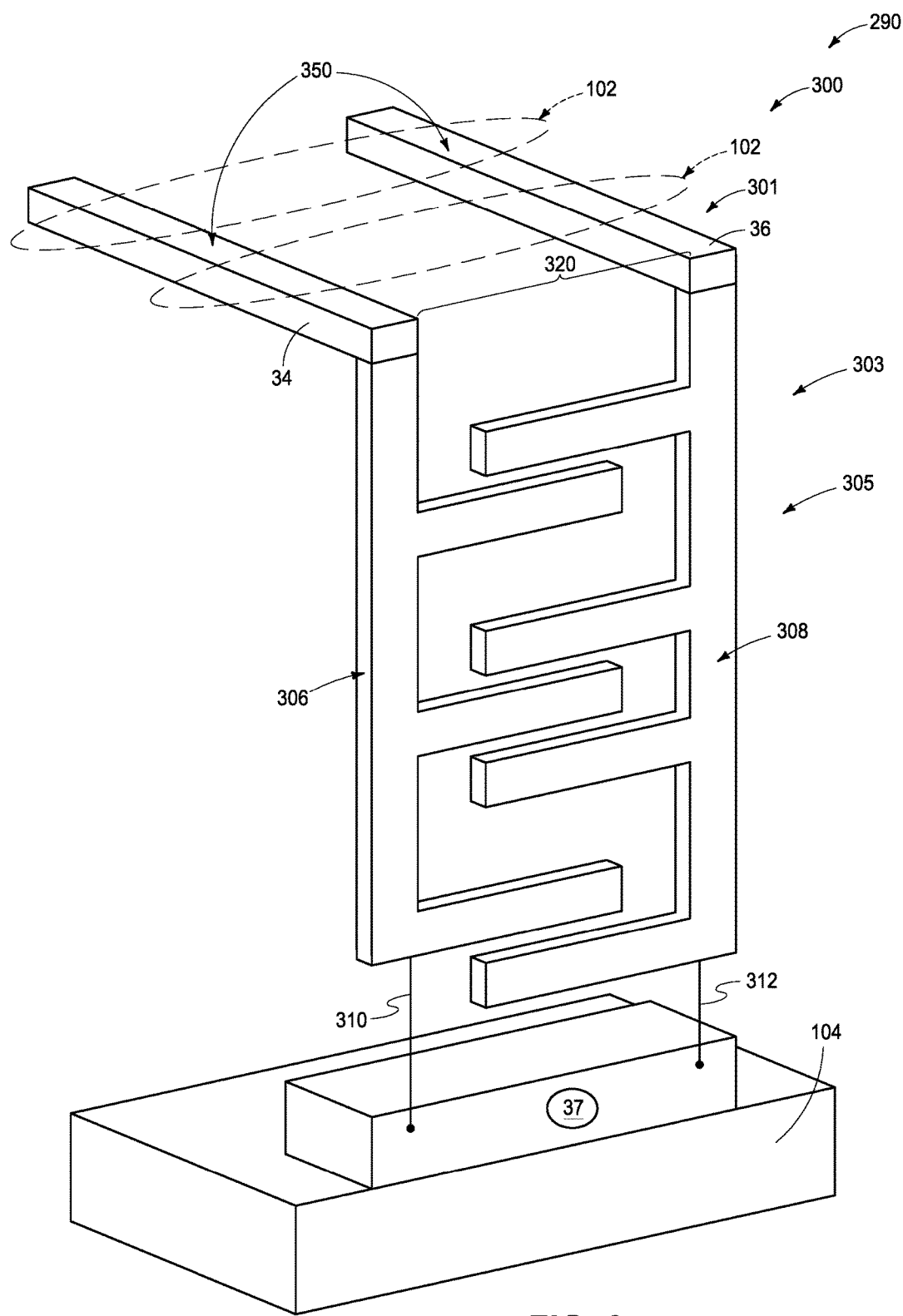
FIG. 6 is a diagrammatic three-dimensional view of a region of an example memory array.

In some embodiments, interconnects (i.e., conductive contacts) may be formed utilizing one or more components in common with the components of memory cells. Such may simplify fabrication, in that common process steps may be utilized for forming the interconnects and the memory cells. For instance, FIG. 6 diagrammatically illustrates a region of an assembly 290 which includes a memory array 300 comprising memory cells 102 of the type described above with reference to FIG. 2. The locations of the memory cells 102 are diagrammatically illustrated relative to the first and second comparative bitlines 34 and 36; with the comparative bitlines 34 and 36 being together comprised by a bitline 350 extending along a column 301 of the memory array 300. Other paired comparative bitlines would extend along other columns of the memory array, but are not shown in order to simplify the illustration. Also, wordlines would extend along rows of the memory array 300, but are not shown in order to simplify the illustration.

The memory array 300 has an edge region 303 where contact is to be made from the comparative bitlines 34 and 36 to circuitry 37 supported by the base 104. An interconnecting structure 305 couples the bitline 350 with the circuitry 37. The interconnecting structure 305 includes a first interconnect (i.e., conductive contact) 306 which extends from the comparative bitline 34 to couple the comparative bitline 34 with the circuitry 37, and includes a second interconnect (i.e., conductive contact) 308 which extends from the comparative bitline 36 to couple the comparative bitline 36 with the circuitry 37. In the illustrated embodiment, the interconnects 306 and 308 extend to wiring structures 310 and 312, respectively, which couple the interconnects 306 and 308 with the circuitry 307. Such wiring structures may be conductive pillars, redistribution lines, conductive pads, and/or any other suitable wiring structures. In alternative embodiments, wiring structures 310 and 312 may be omitted and the interconnects 306 and 308 may extend to directly contact with components of circuitry 37.

The circuitry 37 may be considered to be circuitry external of the memory array 300. The circuitry 37 may be under the memory array 300 (as shown), or in other embodiments may be above the memory array, laterally adjacent memory, or in any other suitable location proximate the memory array.

In some embodiments, the interconnects 306 and 308 may be considered to be configured identically to the structures 130 and 132 described above with reference to FIG. 2. In such embodiments, the intervening region 134 described above with reference to FIG. 2 may be considered to be a first type of intervening region which includes the channel pillars 106, 108, 120 and 122 of the four transistors P1, P2, N1 and N2. The interconnects 306 and 308 may be considered to be spaced from one another by a second type of intervening region 320 which is identical to the first type of intervening region 134 (FIG. 2), except for lacking the channel pillars 106, 108, 120 and 122. Each of the other columns of the memory array 300 (not shown in FIG. 6) may have an interconnecting structure similar to the interconnecting structure 305 shown relative to the column 301.

Figure 7:
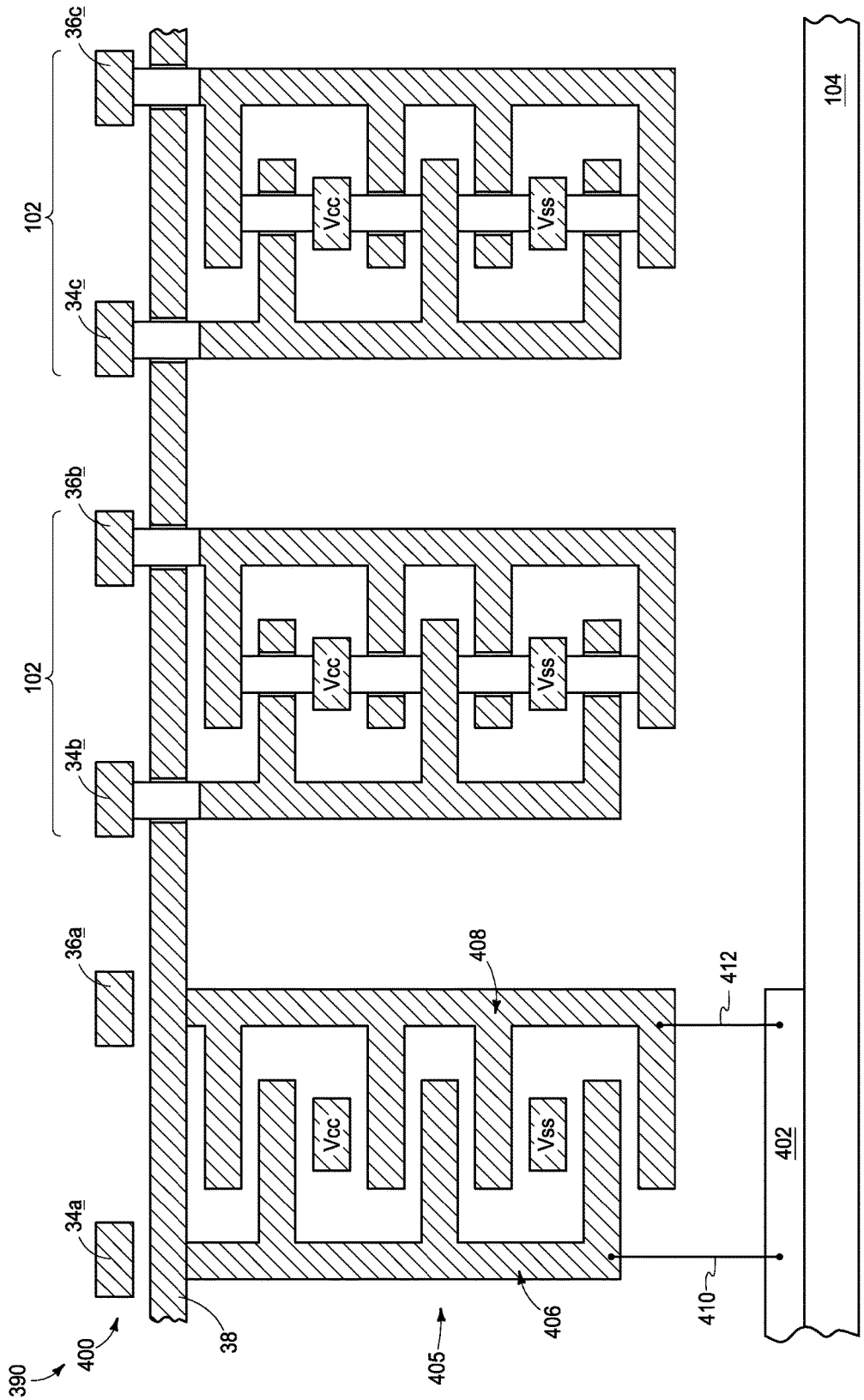
FIG. 7 is a diagrammatic cross-sectional side view of a region of an example memory array.

As another example, FIG. 7 diagrammatically illustrates a region of an assembly 390 which includes a memory array 400 comprising memory cells 102 of the type described above with reference to FIG. 2. A wordline 38 extends along a row of the memory array 400. The wordline is coupled with wordline driver circuitry (e.g., logic circuitry) 402 through an interconnecting structure 405. The interconnecting structure 405 includes a first interconnect (i.e., conductive contact) 406, and a second interconnect (i.e., conductive contact) 408; and is similar to the interconnecting structure 305 discussed above with reference to FIG. 6. In the illustrated embodiment, the interconnects 406 and 408 extend to wiring structures 410 and 412, respectively, which couple the interconnects 406 and 408 with the circuitry 402. Such wiring structures may be conductive pillars, redistribution lines, conductive pads, and/or any other suitable wiring structures. In alternative embodiments, wiring structures 410 and 412 may be omitted and the interconnects 406 and 408 may extend to directly contact with components of circuitry 402. In yet other alternative embodiments, only one of the interconnects 406 and 408 may be electrically coupled with the driver circuitry 402.

The driver circuitry 402 may be considered to be circuitry external of the memory array 400. The circuitry 402 may be under the memory array 400 (as shown), or in other embodiments may be above the memory array, laterally adjacent memory, or in any other suitable location proximate the memory array.

The memory cells described above may be utilized with any suitable interface in addition to, or alternatively to, a traditional SRAM interface. In some embodiments, the memory cells may be utilized as pseudo-SRAM (i.e., SRAM behind a non-SRAM interface). In some embodiments, the memory cells may be utilized with a DRAM interface.

The memory cells described herein may provide advantages as compared to conventional DRAM cells in that the memory cells described herein may be stable in the absence of refresh, in that utilization of the memory cells described herein may avoid row-hammer disturb mechanisms associated with conventional DRAM, in that reliability may be improved due to lower voltages on wordlines as compared to conventional DRAM, in that variable retention time (VRT) issues may be eliminated, etc.

The structures and memory arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory cell having two pulldown devices and two pullup devices supported by a base and vertically offset from the base. The two pulldown devices are first and second pulldown devices, and the two pullup devices are first and second pullup devices. The first pullup device and first pulldown device are together comprised by a first inverter. The second pullup device and second pulldown device are together comprised by a second inverter. The first and second inverters have first and second inverter outputs, respectively. The first and second pullup devices are vertically stacked one atop another. The first and second pulldown devices are vertically stacked one atop another. A first access transistor gatedly couples the first inverter output to a first comparative bitline. The first access transistor has a first access transistor gate. A second access transistor gatedly couples the second inverter output to a second comparative bitline. The second access transistor has a second access transistor gate. The first and second access transistor gates are coupled to one another through a wordline. The wordline has a first side and an opposing second side, with the second side being vertically displaced relative to the first side. The first and second inverters are along the first side of the wordline, and are vertically displaced from the wordline. The first and second comparative bitlines are laterally adjacent to one another along the second side of the wordline, and are vertically displaced from the wordline.

Some embodiments include a memory cell which includes four transistors supported by a base and vertically offset from the base. The four transistors include first and second p-channel transistors, and first and second n-channel transistors. The first p-channel transistor and first n-channel transistor are together comprised by a first inverter. The second p-channel transistor and second n-channel transistor are together comprised by a second inverter. The first and second inverters have first and second inverter outputs. The first and second p-channel transistors are vertically stacked one atop another. The first and second n-channel transistors are vertically stacked one atop another. A first access transistor gatedly couples the first inverter output to a first comparative bitline. The first access transistor has a first access transistor gate. A second access transistor gatedly couples the second inverter output to a second comparative bitline. The second access transistor has a second access transistor gate. The first and second access transistor gates are coupled to one another through a wordline. The wordline has a first side and an opposing second side, with the second side being vertically displaced relative to the first side. The four transistors are along the first side of the wordline, and are vertically displaced from the wordline. The first and second comparative bitlines are laterally adjacent to one another along the second side of the wordline, and are vertically displaced from the wordline.

Some embodiments include an apparatus comprising a memory array having rows and columns. Wordlines are along the rows. Comparative bitlines are along the columns. The comparative bitlines are in pairs along each column. Each pair of the comparative bitlines including a first comparative bitline and a second comparative bitline. The memory array includes a plurality of memory cells. Each of the memory cells is uniquely addressed with one of the wordlines and one pair of the comparative bitlines. Each of the memory cells comprises two p-channel transistors and two n-channel transistors. The p-channel and n-channel transistors are arranged within a first inverter and a second inverter. The first and second inverters have first and second inverter outputs, respectively. Each of the memory cells comprises a first access transistor gatedly coupling the first inverter output with a first comparative bitline of a pair of comparative bitlines uniquely addressing the memory cell, and comprises a second access transistor gatedly coupling the second inverter output with a second comparative bitline of the pair of comparative bitlines uniquely addressing the memory cell. One of the memory cells is a first memory cell and is uniquely addressed by a first wordline and a first pair of the comparative bitlines. The first and second comparative bitlines of said first pair are laterally adjacent to one another and on an opposing side of the first wordline from the p-channel transistors and the n-channel transistors of the first memory cell. Another of the memory cells is a second memory cell, and is vertically stacked relative to the first memory cell. The second memory cell shares the first pair of the comparative bitlines with the first memory cell. The second memory cell is substantially a mirror image of the first memory cell across a plane extending through the first pair of the comparative bitlines.

Some embodiments include an apparatus comprising a semiconductor base and a memory array supported by the semiconductor base. The memory array includes a plurality of memory cells. Each of the memory cells comprises four transistors vertically stacked one atop another. The four transistors include first and second p-channel transistors, and first and second n-channel transistors. The first p-channel transistor and first n-channel transistor are together comprised by a first inverter. The second p-channel transistor and second n-channel transistor are together comprised by a second inverter. The first and second inverters have first and second inverter outputs, respectively. The first and second p-channel transistors have first and second pullup gates, respectively. The first and second n-channel transistors have first and second pulldown gates, respectively. The first pullup gate and the second pulldown gate are coupled to a first vertically-extending interconnect structure comprising the first inverter output. The second pullup gate and the first pulldown gate are coupled to a second vertically-extending interconnect structure comprising the second inverter output. The first and second vertically-extending interconnect structures are laterally offset from one another and are spaced from one another by an intervening region comprising said four transistors. A first access transistor gatedly couples the first inverter output to a first comparative bitline. The first access transistor has a first access transistor gate. A second access transistor gatedly couples the second inverter output to a second comparative bitline. The second access transistor has a second access transistor gate. The first and second access transistor gates are coupled to one another through a wordline. The wordline is over said four transistors. The first and second comparative bitlines are laterally adjacent to one another and on an opposing side of said wordline from said four transistors.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
   two pulldown devices and two pullup devices supported by a base; the two pulldown devices being first and second pulldown devices, and the two pullup devices being first and second pullup devices; the first pullup device and first pulldown device being together comprised by a first inverter; the second pullup device and second pulldown device being together comprised by a second inverter; the first and second inverters having first and second inverter outputs, respectively;
   the first and second pullup devices being one atop another;
   the first and second pulldown devices being one atop another;
   a first access transistor gatedly coupling the first inverter output to a first comparative bitline; the first access transistor having a first access transistor gate;
   a second access transistor gatedly coupling the second inverter output to a second comparative bitline; the second access transistor having a second access transistor gate; and
   a wordline coupling the first and second access transistor gates to one another; the wordline having a first side and an opposing second side; the first and second inverters being adjacent the first side of the wordline, and the first and second comparative bitlines being adjacent the second side of the wordline.

2. The memory cell of claim 1, wherein the pulldown devices are n-channel transistors.

3. The memory cell of claim 2, wherein at least one of the pullup devices is a p-channel transistor.

4. The memory cell of claim 2, wherein at least one of the pullup devices is a resistor.

5. A memory cell, comprising:
first and second p-channel transistors; the first and second p-channel transistors being one atop another;
first and second n-channel transistors; the first and second n-channel transistors being one atop another;
the first p-channel transistor and first n-channel transistor being together comprised by a first inverter; the second p-channel transistor and second n-channel transistor being together comprised by a second inverter; the first and second inverters having first and second inverter outputs, respectively;
a first access transistor gatedly coupling the first inverter output to a first comparative bitline; the first access transistor having a first access transistor gate;
a second access transistor gatedly coupling the second inverter output to a second comparative bitline; the second access transistor having a second access transistor gate; the first and second access transistor gates being coupled to one another through a wordline; the wordline having a first side and an opposing second side; the first and second p-channel transistors and the first and second n-channel transistors, being adjacent the first side of the wordline; and
the first and second comparative bitlines being adjacent the second side of the wordline.

6. The memory cell of claim 5, wherein:
the first and second n-channel transistors are comprised by a first stack;
the first and second p-channel transistors are comprised by a second stack; and
the second stack is laterally displaced from the first stack and horizontally aligned with the first stack.

7. A memory array comprising the memory cell of claim 6 as one memory cell within a plurality of memory cells; wherein
an axis through the first and second comparative bitlines defines a mirror plane; and
another memory cell is on an opposing side of the mirror plane from said one memory cell and is substantially a mirror image of said one memory cell across the mirror plane; said other memory cell sharing the first and second comparative bitlines with said one memory cell.

8. The memory cell of claim 5, wherein the first p-channel transistor, the second p-channel transistor, the first n-channel transistor and the second n-channel transistor are vertically stacked one atop another.

9. The memory cell of claim 8, wherein both of the p-channel transistors are over both of the n-channel transistors.

10. The memory cell of claim 8, wherein:
the first p-channel transistor has a first pullup gate surrounding a first channel region;
the second p-channel transistor has a second pullup gate surrounding a second channel region;
the first n-channel transistor has a first pulldown gate surrounding a third channel region;
the second n-channel transistor has a second pulldown gate surrounding a fourth channel region;
the first, second, third and fourth channel regions are within first, second third and fourth vertically-extending pillars, respectively; and
the second vertically-extending pillar is over the first vertically-extending pillar which is over the third vertically-extending pillar which is over the fourth vertically-extending pillar.

11. The memory cell of claim 10, wherein the first, second, third and fourth vertically-extending pillars are aligned within one another along a vertical axis.

12. The memory cell of claim 11, wherein
a first circuit supply line is vertically between the first and second p-channel transistors and is coupled with source regions of the first and second p-channel transistors;
a second circuit supply line is vertically between the first and second n-channel transistors and is coupled with source regions of the first and second n-channel transistors;
the first circuit supply line is coupled with a first reference voltage and the second circuit supply line is coupled with a second reference voltage; and
the first reference voltage is higher than the second reference voltage.

13. A memory array comprising the memory cell of claim 5 as one memory cell within a plurality of memory cells; wherein
an axis through the first and second comparative bitlines defines a mirror plane; and
another memory cell is on an opposing side of the mirror plane from said one memory cell and is substantially a mirror image of said one memory cell across the mirror plane; said other memory cell sharing the first and second comparative bitlines with said one memory cell.

14. An apparatus comprising:
a memory array having rows and columns: the memory array being supported by a silicon-containing base;
wordlines along the rows;
comparative bitlines along the columns; the comparative bitlines being in pairs along each column; each pair of the comparative bitlines including a first comparative bitline and a second comparative bitline;
a plurality of memory cells;
each memory cell within the plurality of memory cells being uniquely addressed with one of the wordlines and one pair of the comparative bitlines;
each memory cell within the plurality of memory cells comprising two p-channel transistors and two n-channel transistors, with the p-channel and n-channel transistors being arranged within a first inverter and a second inverter; the first and second inverters having first and second inverter outputs, respectively;
each memory cell within the plurality of memory cells comprising a first access transistor gatedly coupling the first inverter output with a first comparative bitline of a pair of comparative bitlines uniquely addressing the memory cell, and a second access transistor gatedly coupling the second inverter output with a second comparative bitline of the pair of comparative bitlines uniquely addressing the memory cell; the first and second access transistors having gates coupled with a wordline uniquely addressing the memory cell;
one of the memory cells within the plurality of memory cells being a first memory cell and being uniquely addressed by a first wordline and a first pair of the comparative bitlines;

the first and second comparative bitlines of said first pair being laterally adjacent to one another and on an opposing side of the first wordline from the p-channel transistors and the n-channel transistors of the first memory cell;

one of the memory cells within the plurality of memory cells being a second memory cell vertically stacked relative to the first memory cell and sharing the first pair of the comparative bitlines; and the second memory cell being substantially a mirror image of the first memory cell across a plane extending through the first pair of the comparative bitlines.

15. The apparatus of claim 14 comprising a second wordline utilized with the first pair of the comparative bitlines to uniquely address the second memory cell; the first and second memory cells being a first set of stacked memory cells; one of the memory cells within the plurality of memory cells being a third memory cell, and another memory cell within the plurality of memory cells being a fourth memory cell; and the apparatus comprising:

the third and fourth memory cells being laterally adjacent the first and second memory cells; the third and fourth memory cells being vertically stacked one atop another and being a second set of stacked memory cells laterally displaced from the first set of stacked memory cells along the first and second wordlines; and the third and fourth memory cells being substantially mirror images of one another across a plane extending through a second pair of the comparative bitlines.

* * * * *